United States Patent [19]
Van Houten et al.

[11] Patent Number: 4,996,570
[45] Date of Patent: Feb. 26, 1991

[54] SEMICONDUCTOR STRUCTURE HAVING A CONDUCTIVE CHANNEL

[75] Inventors: Hendrik Van Houten, Croton-on-Hudson, N.Y.; Bart J. Van Wees, Delft, Netherlands

[73] Assignee: U.S. Philips Corp., New York, N.Y.

[21] Appl. No.: 288,063

[22] Filed: Dec. 20, 1988

[30] Foreign Application Priority Data

Dec. 23, 1987 [NL] Netherlands .................. 8703119

[51] Int. Cl.$^5$ ............................. H01L 29/80
[52] U.S. Cl. ............................. 357/22; 357/30
[58] Field of Search ............. 357/30 B, 30 C, 30 D, 357/30 E, 30 G, 30 H, 30 I, 22 G, 22 MD, 22 A, 22 J, 22 I, 16, 56

[56] References Cited

U.S. PATENT DOCUMENTS

| | | | |
|---|---|---|---|
| 4,112,455 | 9/1978 | Seliger et al. | 357/22 I |
| 4,677,457 | 6/1987 | Wolter | 357/22 A |
| 4,739,385 | 4/1988 | Bethea et al. | 357/22 A |
| 4,740,823 | 4/1988 | Thompson | 357/22 A |

FOREIGN PATENT DOCUMENTS

| | | | |
|---|---|---|---|
| 57-181159 | 11/1982 | Japan | 357/22 G |
| 58-4979 | 1/1983 | Japan | 357/22 G |
| 59-5675 | 1/1984 | Japan | 357/22 MD |
| 59-149063 | 8/1984 | Japan | 357/22 MD |
| 61-159769 | 7/1986 | Japan | 357/22 MD |
| 62-200772 | 9/1987 | Japan | 357/22 A |
| 1121653 | 7/1968 | United Kingdom | 357/22 G |

Primary Examiner—Rolf Hille
Assistant Examiner—Minhloan Tran T.
Attorney, Agent, or Firm—Steven R. Biren

[57] ABSTRACT

The invention relates to an electric element, whose conductance is quantized in units $2e^2/h$ realized in a multi-dimensional charge carrier gas, which is provided with a part of reduced width having a width of the order of the Fermi wavelength and a length smaller than the average free path length. Due to the small width of the part of reduced width, the energy levels are subdivided, as a result of which, at a temperature at which the distance between the levels is comparable with kT, the charge transport through the constriction is determined by quantum-mechanical effects. For the charge carrier gas, for example, a two-dimensional electron gas near a GaAs-AlGaAs hetero-junction may be used, for example, in a voltage divider.

20 Claims, 8 Drawing Sheets

SEMICONDUCTOR STRUCTURE HAVING A CONDUCTIVE CHANNEL

BACKGROUND OF THE INVENTION

The invention relates to an element for use in an electric circuit having a layer or a layer structure; in which a multi-dimensional charge carrier gas can be formed and in which two regions are situated, which communicate with each other via a channel for the transport of charge carriers.

The term "multi dimensional charge carrier gas" is to be understood to means a three- or two-dimensional gas. A charge carrier gas of the last-mentioned kind is situated, for example, in the proximity of a hetero-junction between a doped semiconductor layer having a relatively large energy gap and an intrinsic semiconductor layer having a relatively small energy gap, the conduction band edge in the last-mentioned semiconductor material behaving energetically at a lower level than in the first-mentioned material. Due to the fact that an energy minimum occurs in the semiconductor material having a relatively small energy gap at a small distance from the junction, a cloud of electrons of very small thickness, i.e. practically a two-dimensional cloud, is generated by transport of electrons from the material having the relatively large energy gap near the hetero-junction. The electrons present in this cloud have a strongly increased mobility due to their spatial separation from the donor ions from which they orginate.

An element of the kink mentioned above is in the form of a HEMT (High Electron Mobility Transistor) known from Nishizawa, "Semiconductor Technologies", Tokyo, 1982, p. 258-271. The HEMT is essentially a field effect transistor, in which the conduction takes place in a practically two-dimensional electron gas. Due to the increased mobility in the electron gas, a high switching speed can be attained with the HEMT. The transistor is normally operated at such a temperature that the electron gas is not completely degenerated. The dimensions of the HEMT are usual for other more conventional types of transistors.

In practically all the elements for use in electric circuits, briefly designated hereinafter as electric elements, deviations in the electrical properties of the element occur. These deviations may be due to spreading in their manufacturing steps. As a result, the electrical properties of the finished products practically always deviate more or less from the values aimed at. Moreover, many electric elements are subjected during operation to ageing processes, as a result of which their electrical properties change.

Besides, deviations may be caused by changes in the environment in which the element is used, such as, for example, variations in the ambient temperature.

Thus, for example, the temperature coefficient of the resistivity of most materials has a value different from zero, as a result of which many elements are more or less sensitive to temperature.

SUMMARY OF THE INVENTION

The invention has for its object to provide an electric element, whose electrical properties are at least substantially independent of spreading in the manufacturing process and of its ambience, especially its ambient temperature.

According to the invention, an element of the kink mentioned above is characterized in that the channel has a length which is smaller than the mean free path of the charge carriers in the charge carrier gas, and that the channel has a width which is of the same order of magnitude as the wavelength of the charge carriers at the Fermi level, as a result of which, at such a temperature that the charge carrier gas is at least substantially completely degenerated, quantization of the conductance of the channel occurs. Unless stated otherwise, the conductance (i.e. the reciprocal value of the resistance) of the element is to be understood hereinafter to mean the conductance of the channel.

Experiments have surprisingly shown that in the element according to the invention, the conductance through the channel and the height of the steps is found to be solely dependent upon universal natural constants. Tolerances in the manufacturing process and variations of the ambient temperature are found to have at least substantially no influence on the height of the steps. It is presumed that with the aforementioned dimensions the electrical properties are dominated by quantum-mechanical effects, as a result of which the transport of charge carriers through the channel from one region to the other region can take place only via a quantized conductance. The size of the steps in the conductance is independent of the specific configuration and composition of the element and of its ambient parameters, such as, for example, its ambient temperature.

It should be noted here that measurements are carried out on an element of the kind mentioned above in which the channel had a width comparable with the width of the channel according to the present invention, but in this element the length of the channel exceeded the mean free path of the charge carriers. In these measurements, the phenomena described did not occur. It is presumed that this is due to scattering in the channel. Moreover, with long channels variations in the width often occur, which may suppress the effect described above. As the channel is made shorter, these two effects will occur less frequently. On the contrary, however, the channel must presumably have a certain length so that it can effectively influence the charge carriers. Preferably, the length of the channel is therefore chosen to be of the order of the Fermi wavelength.

the invention will now be described more fully with reference to several embodiments and an accompanying diagrammatic drawing. In the drawing:

BRIEF DESCRIPTION OF THE DRAWING

The figures are schematic and not drawn to scale. For the sake of clarity, certain dimensions are greatly exaggerated. Corresponding parts are generally designated by like reference numerals.

DESCRIPTION OF THE PREFERRED EMBODIMENTS

Figure 1A:
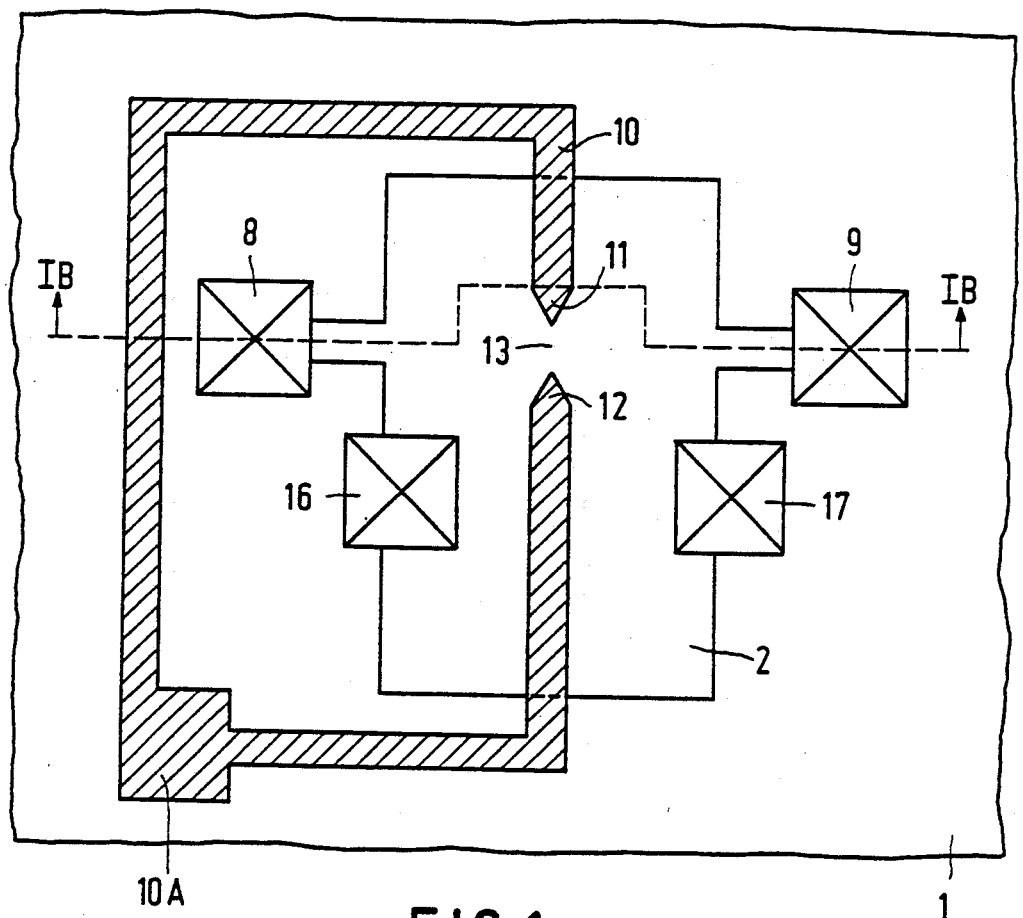
FIGS. 1A and 1B show in plan view and in sectional view taken on the line B—B, respectively, a first embodiment of the element according to the invention.
Figure 1B:
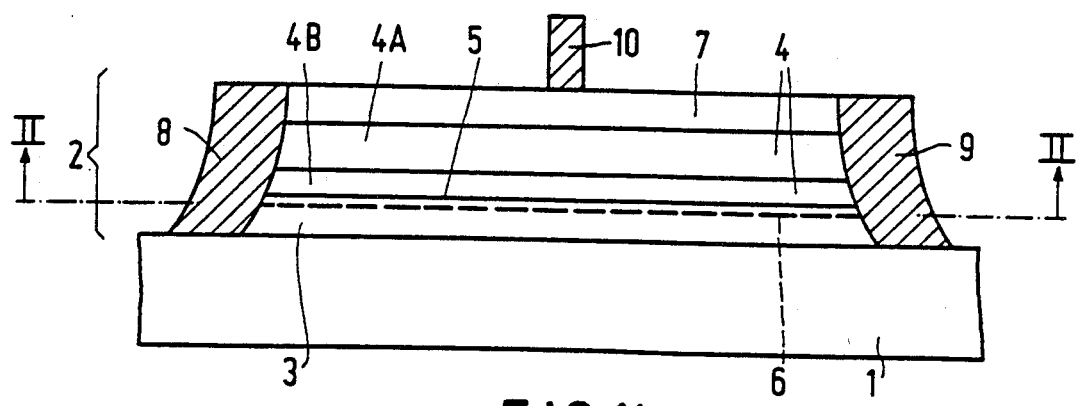

FIGS. 1A and 1B show a first embodiment of the element according to the invention. The element comprises a semiconductor substrate 1 of semi-insulating GaAs. A layer structure is provided in the form of a mesa 2 on the substrate. The layer structure comprises an undoped semiconductor layer 3 of a first semiconductor material, in this case an approximately $1/\mu m$ thick intrinsic GaAs layer, and a doped semiconductor layer 4 of a second semiconductor material, in this embodiment an approximately 60 nm thick layer of $Al_x GA_{1-x}As$ doped with silicon impurities, provided on the layer 3. A specific value for x is, for example, approximately 0.35 and a specific concentration of the silicon is approximately $10^{18}$ ions/cm$^3$. The layer 4 has a larger energy gap than the layer 3. At an interface 5 of both layers 3, 4, a practically two-dimensional electron gas 6 is formed. The layer 4 may be doped, if desired, throughout its thickness with silicon ions. In this embodiment, however, the layer 4 is composed of an approximately 50 nm thick doped first sublayer 4A and an approximately 10 nm thick second sublayer 4B which is free from silicon ions and adjoins the layer 3. The layer 4B has for its object to reduce the influence of the silicon ions on the mobility of the electron gas 6. Of course, the layer 4 may contain instead of donors also acceptors, as a result of which a hole gas is formed instead of an electron gas. As is usual for example, with HEM transistors, the layer 4 is coated for passivation with an approximately 10 nm thick GaAs layer 7.

The mesa 2 is provided with two electrical connections 8, 9 for passing current through the electron gas 6. The connections are made of an alloy of gold, germanium and nickel. In the present embodiment, the distance between the connections 8, 9 is approximately $200/\mu m$, which is an order higher than the average free path length of approximately $10/\mu m$. The overall resistance of the element is the resistance of the channel plus a contact resistance of the connections 8, 9 and a series resistance of the source and drain regions 18, 19. The contact resistance can be eliminated practically entirely by providing the element with two further connections 16, 17 between which a substantially currentless measurement takes place with the given current between the connections 8, 9. When moreover the further connections 16, 17 are spaced apart within a mean free path of the charge carriers in the carrier gas, the series resistance can be eliminated, as a result of which practically only the resistance of the channel is measured.

On the mesa 2 is disposed a gate electrode 10 of gold, which is provided with an opening 13 between two points 11, 12 facing each other. The distance between the points 11, 12 is in the present case approximately 250 nm. It should be noted that in the Figure the points 11, 12 are represented as pure points, but that actually the opening 13 will have a finite length of about 100 nm. Thus, this length is of the order of the Fermi wavelength, i.e. about 42 nm, which is probably an optimum for the envisaged result. The gate electrode 10 constitutes with the underlying GaAs layer 7 a rectifying Schottky junction. When a negative potential is applied to the gate electrode 10, the layer structure 2 is depleted below the gate electrode 10. With a sufficiently negative voltage, the electron gas 6 is pushed away below the gate electrode 10. It has been found that this takes place with the relevant element at a voltage amounting to approximately $-0.6$ V. This means that at this voltage (and a lower voltage) conduction between the connections 8, 9 is possible only through a non-depleted channel in the depletion region below the opening 13.

Figure 2:
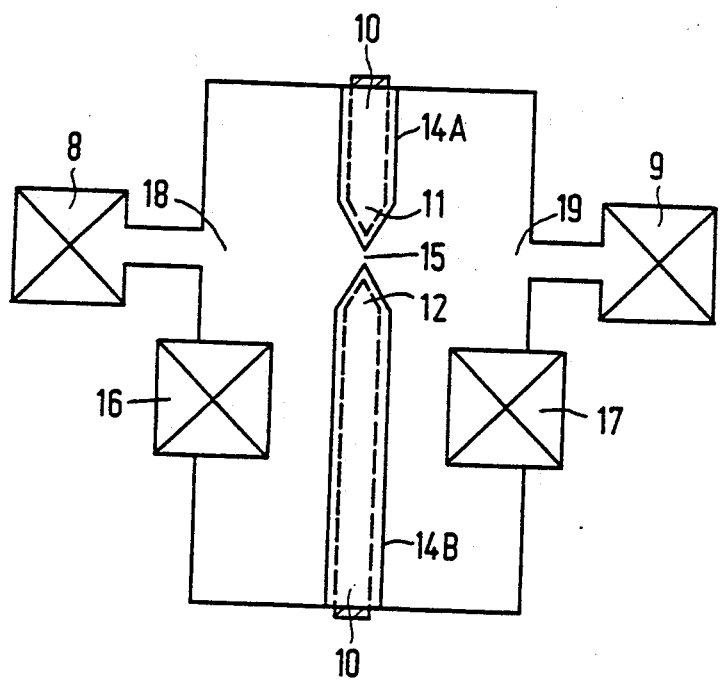
FIG. 2 is a sectional view taken on the line II—II at the area of the electron gas in the first embodiment.
Figure 3A:
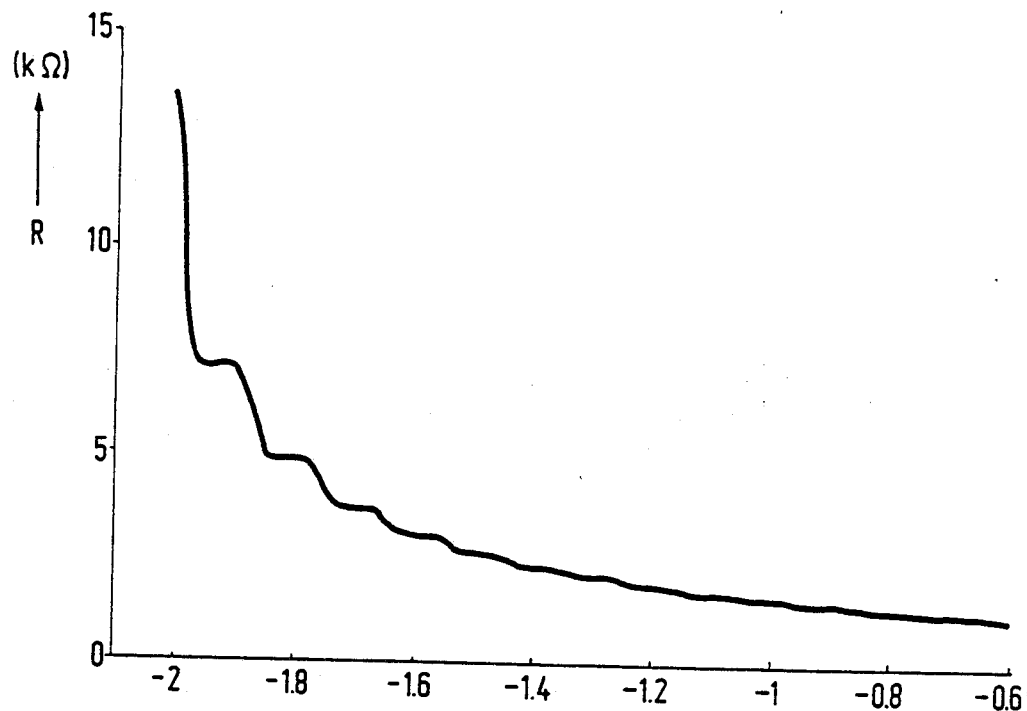
FIGS. 3A and 3B show the resistance and the conductance, respectively, of the element as a function of the voltage applied to the gate electrode.
Figure 3B:
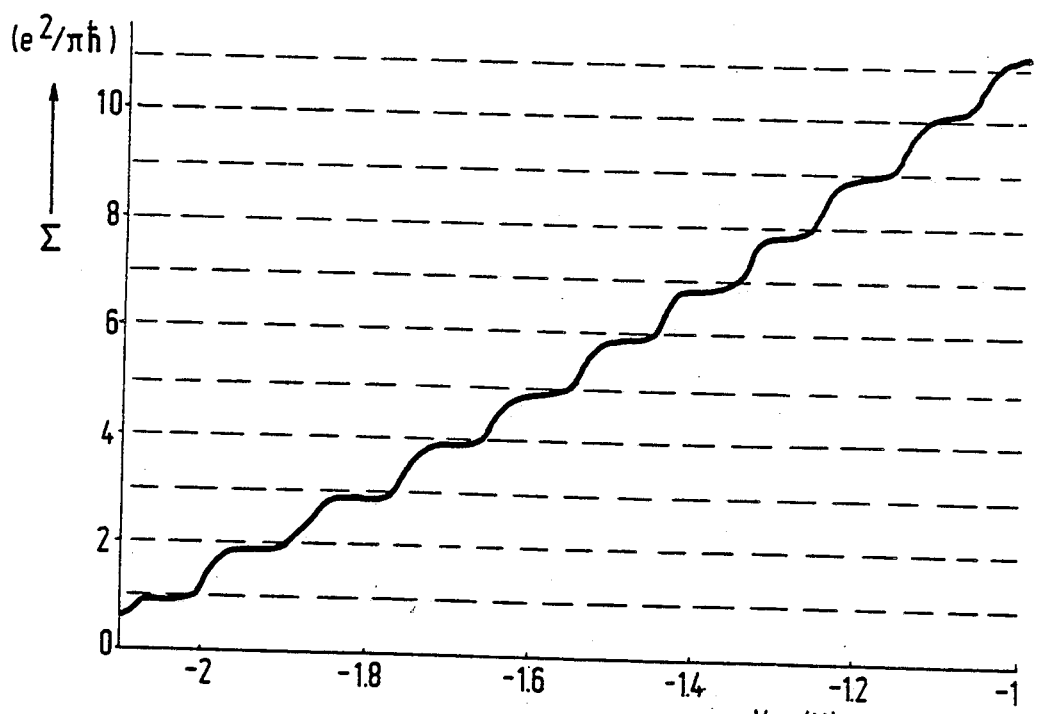

FIG. 2 is a sectional view of the mesa 2 at the area of the electron gas 6 at a gate voltage lower than $-0.6$ V. In the Figure, the broken line indicates a perpendicular projection of the gate electrode on the plane of the sectional view. The depletion regions 14A, 14B below the gate electrode 10 define the channel 15. The two regions 18, 19 of the electron gas 6 are connected to the connections 8 and 9, respectively, and communicate with each other via the channel 15. The channel 15 has a width w and a length l. In order to operate the element, the electron gas is brought into an at least substantially completely degenerated state by cooling the element to a temperature of, for example, approximately 1.4 K. By varying the voltage at the gate electrode 10, the depletion regions 14A, 14B are modulated, as a result of which the width w can be regulated. Measurements with which the voltage at the gate electrode is continuously reduced from $-0.6$ V to approximately $-2$ V show that the electrical conductance of the channel decreases stepwise. FIG. 3A shows the resistance R of the channel as a function of the voltage V, applied to the gate electrode 10. On the ordinates the resistance and voltage are plotted in units of $K\Omega$ and volts respectively. It appears from this Figure that the resistance decreases stepwise of the gate electrode voltage is increased from approximately $-2$ B to approximately $-2$ B. This trajectory is shown separately in FIG. 3B, in which the conductance, $\Sigma$, of the channel is plotted against the voltage, V, applied to the gate electrode. The conductance is plotted on the ordinate in units of $2e^2/h$, where e is the elementary charge and h is the Planck constant. It appears from the Figure that the conductance increases by constant steps having a size of $2e^2/h$ with increasing gate voltage e. Therefore, the size of the steps is determined by the universal natural constants e and h and does not depend upon specific parameters of the element. Thus, for example, the element becomes particularly suitable as reference resistor for use in, for example, a voltage divider.

The effect observed might be explained by assuming that with the said dimensions and conditions in which the element is operated, the conductance through the channel is dominated by quantum-mechanical effects. With a large width w of the channel 15, the electron gas behaves in a conventional manner, in which event the electrons can pass the channel from all directions. In the absence of scattering other than reflective scattering at the walls of the channel, the resistance of the channel will be solely determined by the limited width w thereof. If, however, the width w if of the same order as the wavelength $\lambda$ of the electrons, which in this case is about 42 nm, it is assumed that only directions are allowed in which the transversal component of the half wavelength fits an integral number of times into the width of the channel, i.e. $w = n \cdot \lambda/2$ with n an integer. In terms of wave Vectors $K = 2\pi/\lambda$, this leads to the following conditions for the transversal component $k_y$ of the wave Vector:

$$K_y = \pm n\pi/w \quad (1)$$

Since the electron gas is degenerated, each electron has a wave vector lying within or on the Fermi circle. The Fermi circle is shown diagrammatically in FIG. 4 in the two-dimensional k-space, the horizontal lines indicating the permitting values for $k_y$ and $k_x$ with a given value of the width w. The subdivision between the lines according to equation (1) has a value $\pi/w$ and therefore becomes smaller as w becomes larger and ultimately results in a continuum for the conventional case. For illustration, the Figure shows a number of k vectors (states), of which the transversal component satisfies the above relation. In order to determine the overall conductance, there must be integrated over all lines falling within the Fermi circle. For carrying out this calculation, there may be started, for example, from the equation for a point contact with ballistic transport in a two-dimensional electron gas:

$$G = 2e^2/h \cdot k_F w/\pi \frac{2e^2}{h} \cdot \frac{k_F w}{\pi} . \quad (2)$$

This equation is a two-dimensional analogon of the equation (2) from an article "A Possible Method For studying Fermi Surfaces" by Yu.W.Sharvin published in Sov. Phys. JETP 21, 655 (1965). With the given small width w of the channel, the equation (1) is rewritten as follows:

$$G = e^2 N_0 w h / 4\pi m \cdot <|k_x|> \quad (3)$$

The brackets indicate an average of the absolute value of the longitudinal component $k_x$ of the wave vector k, in all directions over the Fermi circle. $N_0$ is equal to $4\pi m/h^2$ and is the density of states in the two-dimensional electron as. Only wave vectors having a length $k_F$, of which the transversal component $k_y$ has a discrete value satisfying $k_y = \pm n\pi/w$ with $n = 1, 2 \ldots$ etc. contribute to the average. According, for the average value of the longitudinal component $k_x$ of the wave vector, there can be written:

$$<|k_x|> = /2\pi k_F d^2 k |k_x| \cdot \delta(k - k_F) \cdot 2\pi/w \quad (4)$$
$$\Sigma \delta(k_y - n\pi/w)$$

Figure 4:
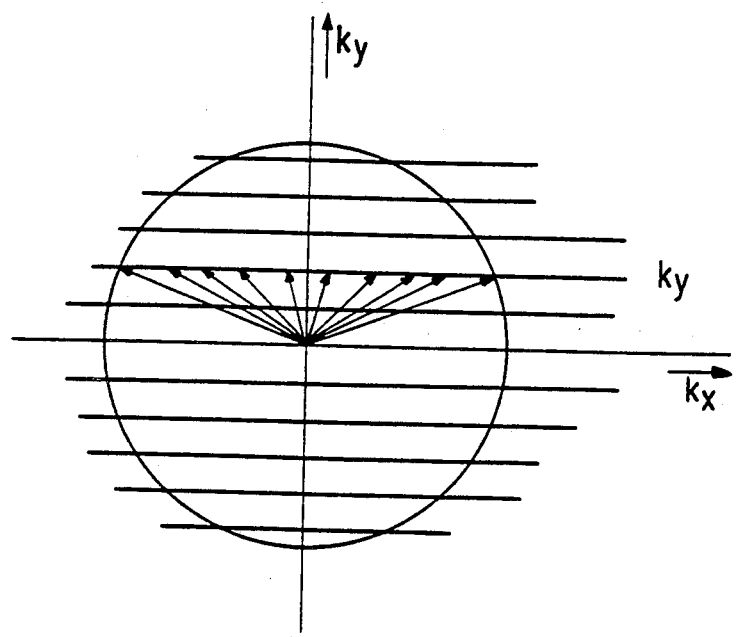
FIGS. 4 and 5 are representations of the Fermi circle in a two-dimensional k-space for different values of the width of the channel.
Figure 5:
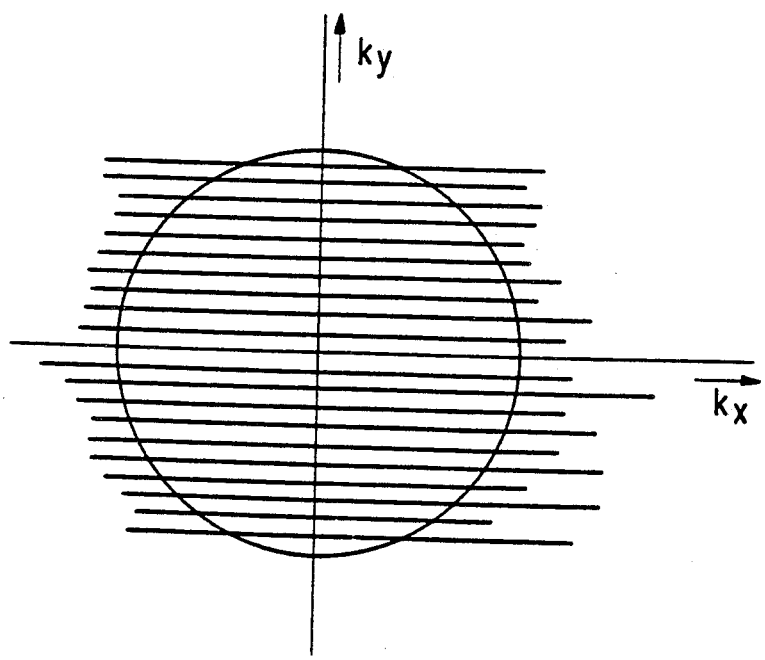

By carrying out the integration and substituting it in the equation (3), the following equation is obtained:

$$G = \sum_{n=1}^{N_c} 2e^2/h \quad (5)$$

in which $N_c$ is the largest integer, which is smaller than $K_F w/\pi$. In FIG. 4, $N_c$ corresponds to the number of pairs of horizontal lines falling within the circle. It follows form equation (5) that the conductance increases stepwise by steps $2e^2/h$ according as $N_c$ increases due to an increase of w. This can be seen in FIG. 4 in that, when w increases, the subdivision between the lines decreases, as a result of which a larger number of lines will fall within the circle. In FIG. 5, this is indicated, for example, for a doubling of the width w of the channel with respect to the case of FIG. 4. The stepwise increase of the conductance as predicted by equation (5), corresponds to the experiments carried out.

At a finite temperature, the electrons have a given quantity of thermal energy. With the described subdivision of the allowed values for $k_y$ an energetic subdivision is associated. As already stated, the subdivision between the allowed values of $k_y$ decreases according as the width w of the channel increases. If with a given width w of the channel the associated energetic subdivision becomes of the same order of magnitude as the thermal energy, the difference between the various allowed values of $k_y$ fades away. The stepwise increase of the conductance will therefore disappear at larger values of the width w. This can be seen in FIG. 3B, in which eleven steps are visible, after which the resistance decreases uniformly.

The device can be manufactured by means of techniques know per se. By means of MBE (Molecular Beam Epitaxy), the layer structure is grown epitaxially on the GaAs substrate 1. The layer structure is covered by a photosensitive layer, which is patterned by exposure and etching, openings being formed at the area of the connections 8, 9, 16, 17 to be provided. Subsequently, the assembly is covered successively by a metal layer of an alloy of Ni, Ge and Au and a metal layer of an alloy of Ti, Pt and Au. As is usual in lift-off processes, the photosensitive layer is removed together with the part of the metal layers disposed thereon. The assembly is then subjected to a thermal treatment at about 400° C., as a result of which the metal layers are alloyed into the layer structure at the area of the connections. Subsequently, an etching mask is provided and the mesa 2 is formed by means of a suitable etchant, for example a mixture of hydrogen perioxide, sulphuric acid and water in a ratio of about 1:4:20. An approximately 1 nm thick Ni-Cr layer is provided on the assembly and this layer is then covered by a 200 nm thick Au layer. Also by means of a lift-off process the gate connection 10A is provided, which comprises an approximately 1 nm thick Ni-Cr layer and a 20 nm thick Au layer disposed thereon. The Ni-Cr layer serves to improve the adhesion of the Au layer. By means of an optical technique the wide part of the gate electrode 10 of, for example, pure Au can be provided. In order to obtain a good step coverage also on the side walls of the mesa 2, the Au layer is preferably vapor-deposited at an angle. The points 11, 12 of the gate electrode 10 are provided in a separate electrolithographic step. For this purpose, the assembly is covered by an electron-sensitive layer. Subsequently, the pattern of the points is written directly into the electron-sensitive layer by means of an electron beam. After development, an approximately 20 nm thick gold layer is vapor-deposited on the electron-sensitive layer and this gold layer is then removed together with the electron-sensitive layer, the layer being left on the mesa 2 at the area of the dots 11, 12.

Figure 6A:
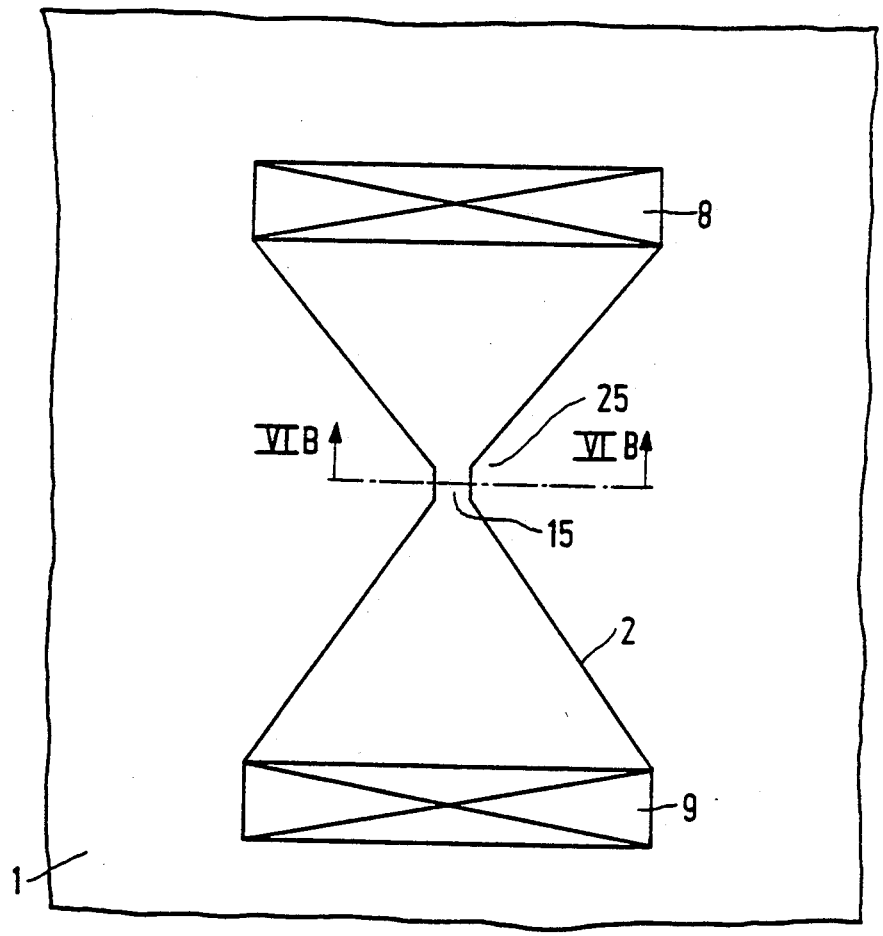
FIGS. 6A and 6B show in plan view an in sectional view taken on the line B—B, respectively, a second embodiment of the element according to the invention.
Figure 6B:
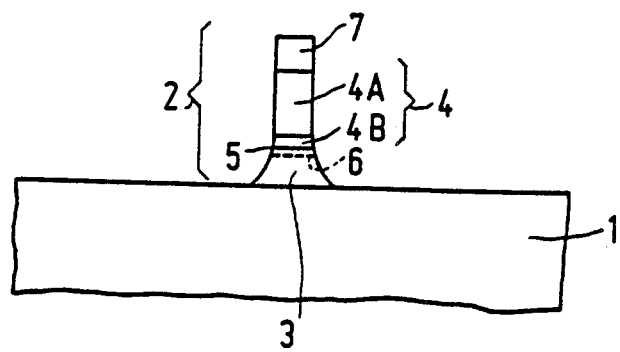

A second embodiment of the element is shown in FIGS. 6A and 6B. the element again comprises a semi-insulating substrate 1, on which a layer structure 4 is grown having the same composition as in the preceding embodiment. A wedge-shaped part of reduced width 25 limiting the channel 15 is formed by etching the layer structure. Thus the layer structure 2 in which the charge carrier gas 6 can be formed is confined to this wedge-shaped part of reduced width 25. In this embodiment, the channel 15 has a fixed width w, which is entirely determined by the part of reduced width 25. By etching further over a larger or smaller distance, the resistance can be adjusted to a desired discrete value $h/2N_ce^2$. This element may be used, for example, as will be described in the following application, as a reference resistor. The part of reduced width is shown in the form of a pure wedge, it is true, but actually the part of reduced width will be slightly rounded off. For example, said wedge-shaped part also can be formed by locally implanting in the layer or layer structure outside said wedge-shape part. Thus, said part is obtained not by removing a part of said layer or layer structure but by conversion thereof outside said part into electrically insulating material. It should be noted that it is sufficient for the part of reduced width to remove in situ the doped layer 4A or only a part thereof. For the sake of completeness, it should be noted that the part of reduced width may be realized not only be etching, but also in a different way.

Figure 7A:
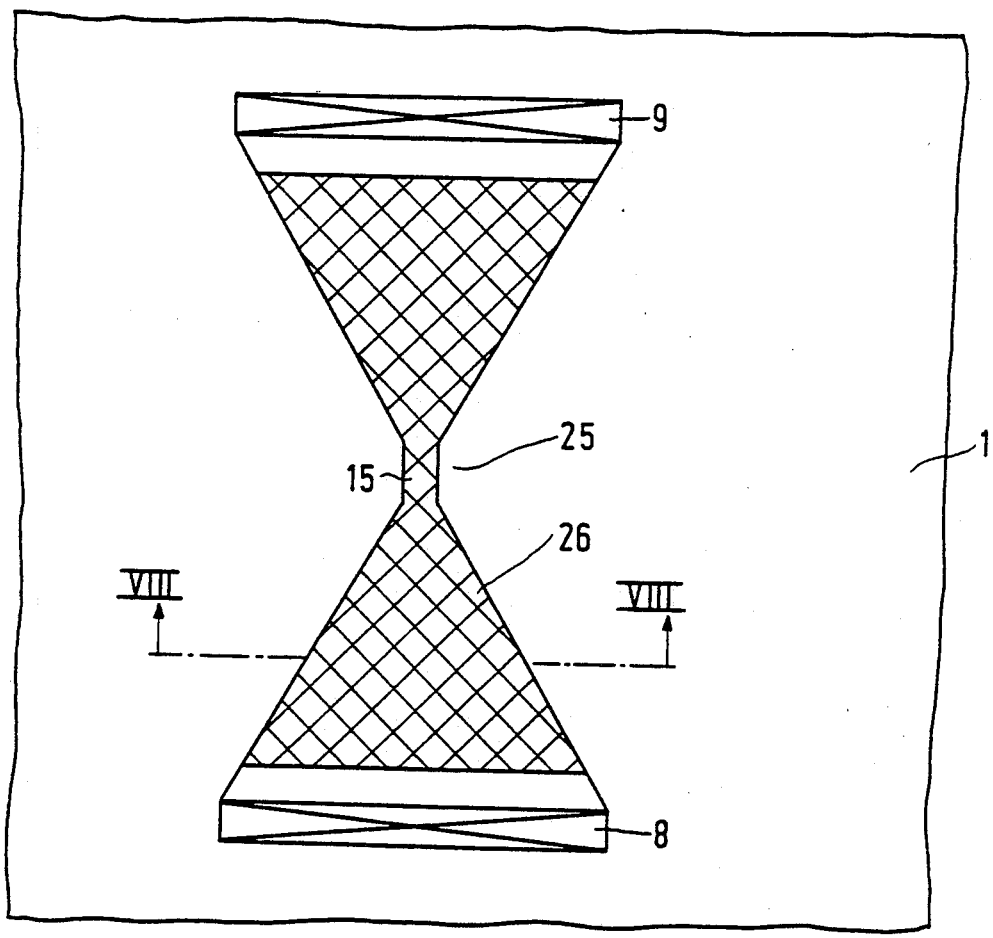
FIGS. 7A and 7B show in plan view and in sectional view taken on the line B—B, respectively, a third embodiment of the element according to the invention.
Figure 7B:
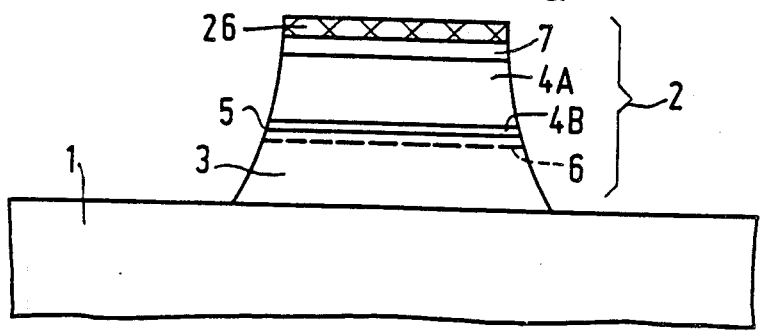

FIGS. 7A and 7B show a third embodiment of the element according to the invention. This embodiment mainly differs from the preceding embodiment only by the presence of means for regulating the density of the charge carrier gas 6. In this embodiment, the means comprise the gate electrode 26. In the present case, this electrode is of the Schottky type, but may also be insulated, for example, by a dielectric layer from the semiconductor body.

Figure 8:
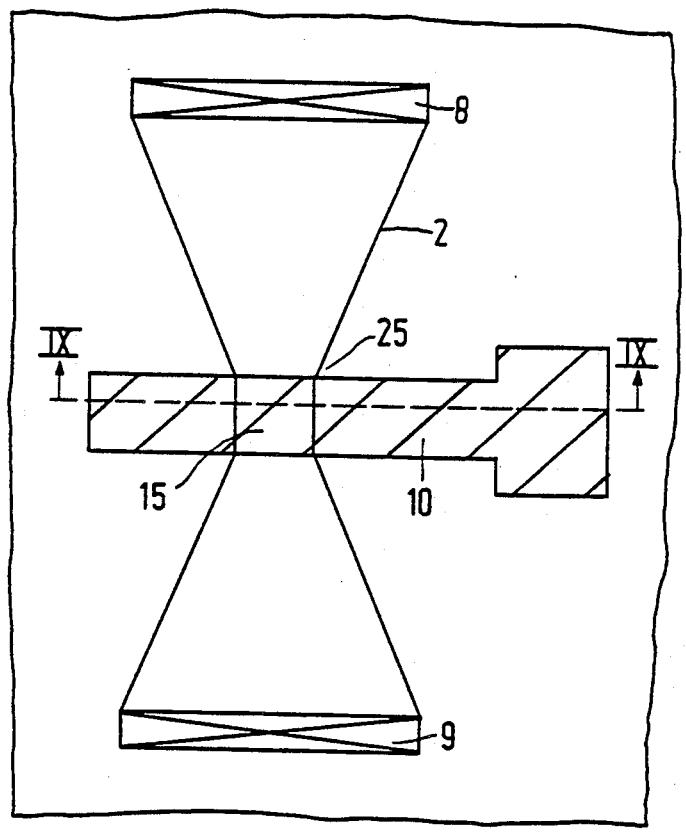
FIGS. 8 and 9 show in plan view and in sectional view taken on the line IX—IX, respectively, a fourth embodiment of the element according to the invention.
Figure 9:
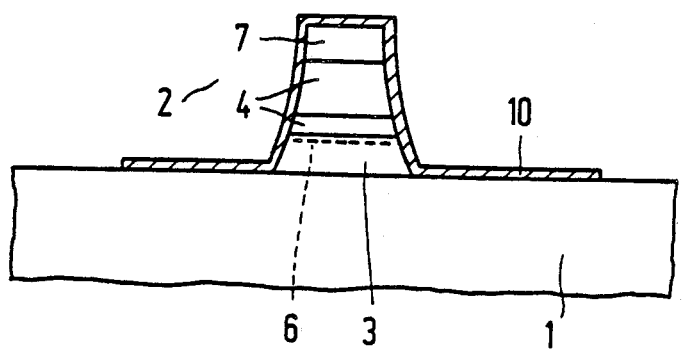

FIGS. 8 and 9 show in plan view and in sectional view, respectively, a fourth embodiment of the element according to the invention. Again a part of reduced width 25 limiting the channel 15 is etched into the mesa 2. At the area of the part of reduced width 25, a narrow gate electrode 10 is arranged at right angles to the mesa 2. Because of the larger allowable minimal width of the present gate electrode as compared to the gate electrode in the first embodiment in this case the whole gate electrode can be provided by means of an optolithographic lift-off process. The gate electrode 10 constitutes a Schottky junction with the mesa 2. The electron gas can be laterally depleted by applying a suitable voltage to the gate electrode. By varying the voltage, the depleted region is modulated and hence the width of the channel is regulated. The layer structure is also depleted from above, it is true, but due to the smaller distance the lateral depletion will be predominant. If desired, an insulating layer may be provided between the part of the gate electrode disposed on the upper surface of the mesa and the mesa in order to reduce the influence of this part.

As already stated above, by regulating the ratio $w/\lambda_F$, the resistance of the element can be adjusted to a given value, which only depends upon universal natural constants. If use is made, for example, of the element according to the first embodiment, the resistance can be adjusted stepwise to a value $h/2e^2 \approx 13$ k$\Omega$ and fractions $1/n$ with $n=2, 3 \ldots 10$ thereof by varying the voltage at the gate electrode between approximately $-2$ V and $-0.6$ V. By applying a strongly negative voltage to the gate electrode, the channel can be entirely pinched off to a very high resistance.

Figure 10:
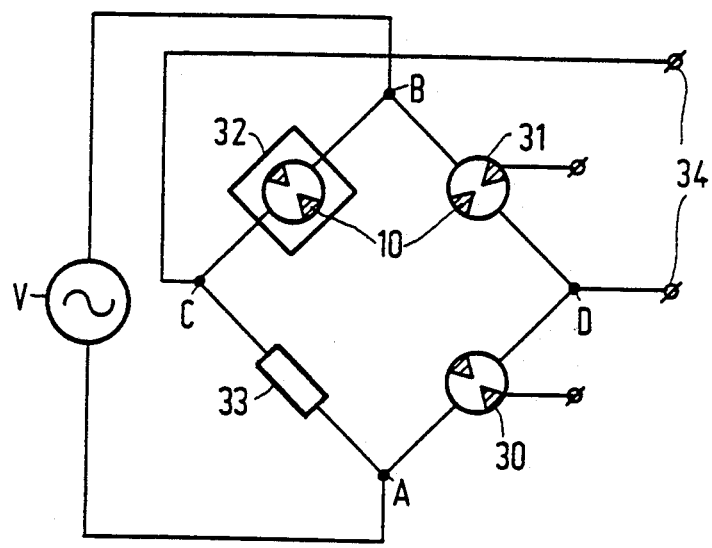
FIGS. 10 and 11 show an application of the element according to the invention in a Wheatstone bridge.

FIG. 10 shows a possible application of an element according to the invention, in which the circle with two pints constitutes an equivalent symbol of an element with a gate electrode which exhibits two facing points with an opening therebetween e.g. such as is used in the element shown in FIG. 1. The two cross-hatched points in the circle represent the gate electrode 10, while the lines on either side of the circle represent the current lead-throughs. In this application, three (30, 31, 32) of these elements are included in a Wheatstone bridge together with a resistor 33 to be measured. The resistor 33 may be, for example, a thermistor. During operation, a voltage V is applied across the branching points A, B. The elements 30, 31, 32 are adjusted, for example, in such a manner that the branching points C, D are on the same potential. The elements 30, 31, 32 are adjusted by applying a suitable voltage to their gate electrodes 10. In order to attain a fine adjustment, the element 32 is composed of a number of elements 321–329 (see FIG. 12). The elements 321–325 are connected in series. The series arrangement 321–325 is connected together with the elements 326–329 parallel between the branching points B, C. The elements 321–329 can be controlled by applying a voltage to their gate connections 351–359. By a suitable combination of the various voltages supplied, the resistance of the whole network 32 can be varied between about 300 $\Omega$ and 65 k$\Omega$. By increasing the number of elements in the network, if desired, the accuracy and the range of the bridge may further be increased.

The elements 30, 31, 321–329 can all be integrated in the same semiconductor body, as the case may be in combination with other switching elements, such as, for example, HEM transistors. It is then no longer necessary to provide electrical connection 8, 9 for each individual element. The source and drain regions 18, 19 can be defined so that they also provide the current lead-throughs of the elements. This has the advantage that the influence of the contact resistance can be reduced.

It should be appreciated that the invention is not limited to the embodiments described herein, but that many further variations are possible within the scope of the invention for those skilled in the art. For example, if desired, the connections 8, 9 may be spaced by a distance exceeding the mean free path. If the length of the channel remains smaller than the mean free path the transport in the channel remains ballistic and the resistance remains quantized, but for the overall resistance of the element a series resistance of the connections should be added.

In the above description of the effect the starting point is a temperature of about 1.4 K, i.e. a temperature which is considerably lower than the Fermi temperature, of about 100 K of the electron gas in he embodiments described. At this temperature, ten steps could be distinguished in the conductance of the channel. As the temperature increases, the difference between the various allowed values of the transversal component of the wave vector becomes smaller due to thermal spread, as a result of which, as already stated above, a smaller number of steps can be distinguished.

If, however, a smaller number of distinguishable steps is required, if desired, a higher temperature may be chosen.

In stead of a layer structure having a GaAs-AlGaAs hetero-junction, other materials may also be used, such as, for example, HgCdTe or Bi. The operation of the element is not limited either to a two-dimensional electron gas, but a three-dimensional electron as may also be sued with a channel limited in two dimensions.

Use of a MIS (Metal-Insulator-Semiconductor) device of the depletion or enhancement type is also possible, which has a gate electrode which is separated from a semiconductor body by a thin insulating layer. In the proximity of the interface between the insulating layer and the semiconductor body, an inversion layer of small thickness may be present, which practically behaves like a two-dimensional charge carrier gas. The density of the charge carriers in the gas can be controlled by the gate electrode. Moreover, the gate electrode can be provided with a part of reduced width, which may form an opening in the gate electrode and defines a narrow and short channel according to the invention in the inversion layer. By the channel the inversion layer is divided into two parts, which communicate with each other iva the channel. The semiconductor body in this embodiment may be made of any desired material, particularly silicon.

Figure 11:
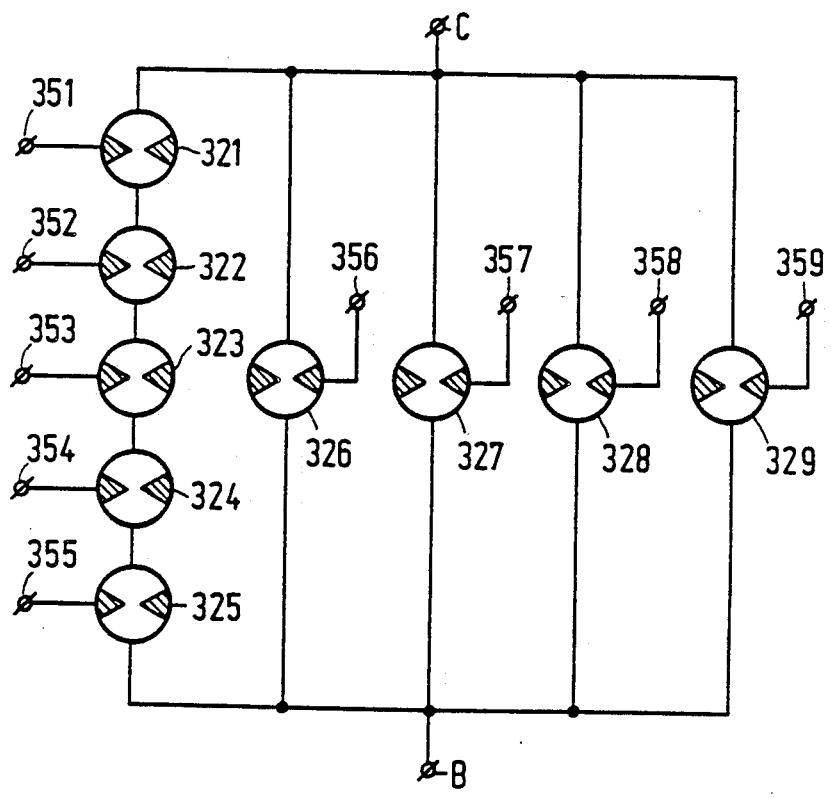

In the application shown in FIGS. 10 and 11, the element forms part of a voltage divider in a bridge circuit. However, the element may also be used in other circuits, such as, for example, in a programmable RC filter or in oscillators with tunable RC times. The stepwise variation of the conductance of the element renders the element also particularly suitable for use in an analog-to-digital converter, the analog signal being supplied to the gate electrode and being subdivided by the element into a number of discrete levels. These levels may be converted by further signal processing circuits, for example into a binary number.

What is claimed is:

1. An element for use in an electric circuit comprising a layer structure, in which a multi-dimensional charge carrier gas is formed during operation and in which first and second regions are situated, which communicate with each other via a channel for transport of charge carriers, further comprising means for maintaining the electrical properties of said element at least substantially independent of changes in ambient parameters and manufacturing process parameters, said means comprising providing the channel with a length between said first and second regions which is smaller than the mean free path of the charge carriers in the charge carrier gas, and providing the channel with a width in a direction orthogonal to its length which is of the same order of magnitude as the wavelength of the charge carriers at the Fermi level, as a result of which, during operation at such a temperature that the charge carrier gas is at least substantially completely degenerated, quantization of the conductance of the channel occurs.

2. An element as claimed in claim 1, characterized in that the length of the channel is also of the same order of magnitude as the wavelength of the charge carriers at the Fermi level.

3. An element as claimed in claim 1 or 2, characterized in that electrical connections are formed at the ends of he channel, the distance between the connections being smaller than the mean free path of the charge carriers.

4. An element as claimed in claim 1 or 2, characterized in that means are present, by which, at such a temperature that the charge carrier gas is at least substantially completely degenerated, the ratio $w/\lambda_F$ can be varied from the value $\frac{1}{2}$ over multiples thereof, w being the width of the channel and $\lambda_F$ being the wavelength of the charge carriers at the Fermi level.

5. An element as claimed in claim 4, characterized in that the density of the charge carrier gas can be adjusted by said means.

6. An element as claimed in claim 4, characterized in that the width of the channel can be regulated by said means.

7. An element as claimed in claim 6, characterized in that the element forms part of an analogue-to-digital converter, the gate electrode being provided with means by which an analog input signal can be supplied, while detection means are provided for determining stepwise variations in the conductance of the channel, which are caused by the input signal and are a measure for a digital output signal.

8. An element as claimed in claim 6, characterized in that said means comprise a gate electrode by which the channel can be depleted at least from one side and the width of the channel is regulated by modulation of the depleted region.

9. An element as claimed in claim 8, characterized in that the gate electrode is provided with an opening which defines the width of the channel.

10. An element as claimed in claim 9, characterized in that the gate electrode has two points which face each other and between which the opening is situated.

11. An element as claimed in claim 8, characterized in that the layer structure comprises semiconductor material and in that the gate electrode is an electrode of the Schottky type.

12. An element as claimed in claim 1 or 2, characterized in that the channel has a fixed width.

13. An element as claimed in claim 1 or 2, characterized in that the charge carrier gas can be formed in only a part of said layer structure, which part exhibits a wedge-shape of reduced width.

14. An element as claimed in claim 13 characterized in that said layer structure is confined to said part.

15. An element as claimed in claim 13, characterized in that said layer structure is electrically insulating outside said part.

16. An element as claimed in claim 1 or 2, characterized in that the layer structure comprises an intrinsic layer of a first semiconductor material and an adjoining doped layer of a second semiconductor material, the second semiconductor material having a larger energy gap than the first semiconductor material and a substantially two-dimensional charge carrier gas being formed at a interface between both layers.

17. An element as claimed in claim 16, characterized in that the layer of the second semiconductor material comprises a doped sublayer and an undoped sublayer, and in that the undoped sublayer is disposed between the doped sublayer and the layer of the first semiconductor material.

18. An element as claimed in claim 16, characterized in that the doped layer comprises aluminum gallium arsenide and the intrinsic layer comprises gallium arsenide, a substantially two-dimensional electron gas being formed at the interface.

19. An element as claimed in claim 1 or 2, characterized in that the element constitutes a resistance element, suitable for use in a voltage divider.

20. An element as claimed in claim 1 or 2, characterized in that the element is provided with at least one connection by means of which an at least substantially currentless measurement of a voltage drop across the channel can be carried out.

* * * * *